(12) United States Patent
Bailis et al.

(10) Patent No.: US 6,373,712 B1
(45) Date of Patent: *Apr. 16, 2002

(54) DEVICE FOR INSERTING CIRCUIT CARDS INTO ELECTRICAL MACHINES

(75) Inventors: Robert Thomas Bailis, Cary; Thomas Lee Bonds, Jr.; David John Jensen, both of Raleigh; Charles Steven Lingafelt, Durham; Brian Scott Oakley, Burlington, all of NC (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/092,169

(22) Filed: Jun. 5, 1998

(51) Int. Cl.[7] ................................. H05K 5/00
(52) U.S. Cl. .................. 361/756; 361/759; 361/802; 439/377
(58) Field of Search .................... 361/756, 759, 361/752, 800, 801, 802; 439/377, 324, 259–262

(56) References Cited

U.S. PATENT DOCUMENTS

| | | | |
|---|---|---|---|
| 3,017,232 A | 1/1962 | Schwab et al. | |
| 3,711,814 A | 1/1973 | Pomella et al. | 339/65 |
| 3,869,185 A | 3/1975 | Teagno | 339/65 |
| 4,445,740 A | 5/1984 | Wallace | 339/45 |
| 4,789,352 A | 12/1988 | Kreinberg et al. | 439/260 |
| 4,941,840 A | 7/1990 | Okada | 439/376 |
| 5,238,423 A | 8/1993 | Hillis et al. | 439/259 |
| 5,302,136 A | 4/1994 | St. Germain et al. | 439/376 |
| 5,317,481 A | 5/1994 | Hillis et al. | 361/796 |
| 5,325,269 A | 6/1994 | Someno | 361/796 |
| 5,363,281 A | 11/1994 | Baitz et al. | 361/801 |
| 5,366,385 A | 11/1994 | Treleaven | 439/377 |
| 5,868,585 A | 2/1999 | Barthel et al. | 439/377 |
| 5,967,824 A * | 10/1999 | Neal et al. | 439/324 |
| 6,033,254 A * | 3/2000 | Neal et al. | 439/377 |
| 6,053,760 A * | 4/2000 | Bailis et al. | 439/377 |

\* cited by examiner

*Primary Examiner*—Jeffrey Gaffin
*Assistant Examiner*—Tuan Dinh
(74) *Attorney, Agent, or Firm*—Joscelyn G. Cockburn (57) ABSTRACT

A frame for inserting and/or removing circuit cards from the housing of a machine includes a circuit card carrier connected to a locking CAM slide that is disposed to move within the channel of an actuator bar. A slot with a locking feature is fabricated on the locking CAM slide. A pin extending from a surface of the actuator bar into the channel coacts with the locking mechanism to lock the actuator bar relative to the locking CAM.

11 Claims, 10 Drawing Sheets

DEVICE FOR INSERTING CIRCUIT CARDS INTO ELECTRICAL MACHINES

CROSS-REFERENCE TO RELATED PATENT APPLICATION

U.S. Pat. No. 5,868,585, appl. Ser. No. 08/764,963, filed Dec. 13, 1996, relates to an actuator and retainer frame assembly for inserting and removing printed circuit cards into and from electrical machines.

U.S. patent appl. Ser. No. 08/728,295, filed Oct. 8, 1996 relates to a plug-in package, including carrier plate with pins, handle and circuit card, for use in electrical machines.

U.S. Pat. No. 6,053,760, appl. Ser. No. 09/092,788 filed concurrently herewith, relates to a Universal Carrier Plate.

The patent applications are assigned to the assignee of the present invention.

BACKGROUND OF THE INVENTION

1. Field of the Invention

The present invention relates to electrical machines in general, and in particular, to the type of electrical machines that allow circuit cards to be plugged and unplugged from one side, usually the front. These electrical machines are sometimes called "Front Access" machines.

2. Prior Art

Because of the rapid explosion in the use of computers and related electrical equipment (e.g., routers, concentrators and other networking devices), there has been a desire to manufacture more user friendly equipment. One of the areas targeted for improvement is the mechanical structure of the devices. In particular, the insertion of circuit cards or circuit boards into machine housings has been targeted for improvement.

The conventional PC or related electronic equipment includes a housing or cabinet in which a motherboard and/or one or more circuit boards are mounted. Electrical communication between the components is effectuated by electrical connectors mounted on the motherboard and the circuit cards. The arrangement between the card and the motherboard can be broadly classified into two groups.

In one group of machines, the card and its connector are inserted in a direction perpendicular to the connector on the motherboard. Examples of prior art devices in this group are set forth in U.S. Pat. No. 3,017,232 (Re 25595); U.S. Pat. Nos. 3,711,814; 4,789,352; 4,941,840; 5,238,423 and 5,363,281.

One of the problems with devices in this group is that most of the cabinetry (housing) has to be removed before the card can be inserted or removed.

Another problem is that a trained technician is usually required in order to change cards. As a consequence, the cost to maintain these machines are unnecessarily high.

In the other group of machines, the card and attached connector are inserted in a parallel direction relative to the motherboard connector. The card is then moved in a perpendicular direction in order to bring the motherboard connector and card connector into mating relationship. Even though this design is a step in the right direction, it is prone to bring damage to the contacts because insertion of the (male or female) connectors are skewed rather than direct. To minimize the likelihood of damage, a more accurate and precise mechanism is required to insert/remove circuit card or board into/from the housing.

Examples of prior art devices in this group are set forth in U.S. Pat. Nos. 3,869,185; 4,445,740; 5,302,136; 5,317,481; 5,325,269 and 5,366,385.

A general observation with the prior art is that the casing or chassis in which the cards are inserted are unnecessarily large in order to accommodate the tools and operations required to insert or remove a card. In addition, the installation procedures are usually complex and not user friendly.

SUMMARY OF THE INVENTION

It is, therefore, an object of the present invention to provide a user friendly and simple installation assembly for inserting or removing cards from a PC or similar machine.

It is another object to provide a device for front card insertion of standard PCI form factor cards.

In accordance with the present invention, an electrical machine comprising a housing with guides positioned within the housing means and at least one sub-assembly for mounting in said housing is disclosed.

The sub-assembly includes a frame for supporting a printed circuit board and an actuator bar with a push arm for positioning the frame. The frame includes a carrier plate and a side portion, hereinafter called locking CAM slide, having a front end, a back end, an outside edge and an inside edge extending along its lengthwise dimensions. A guide member, for providing easy insertion of the sub-assembly in the housing, is provided at the front end of the locking CAM slide. A semi-circular notch, allowing easy access to the push arm, is fabricated on the back end of the locking CAM slide. At least one slot, having one (angled) section oriented at an angle to the inside edge and at least one (horizontal) section orientated substantially parallel to the inside edge, is fabricated on the side portion. A locking structure is also provided in the slot. The slot includes at least one access opening.

The actuator bar includes a substantially U-shaped structure with a substantially U-shaped channel and a pin extending from one of the sides into the channel. In forming the sub-assembly, the locking CAM slide is slideably mounted in the channel and the pin is aligned in the slot. The relationship between the locking CAM slide and the actuator is such that when the pin is positioned at the locking structure, there is no relative motion between the actuator bar and the side portion. Stated another way, the actuator bar is locked. When the pin is displaced from the locking structure, the actuator bar moves relative to the locking CAM slide.

Fastening mechanisms for connecting the locking CAM slide to the carrier plate are provided on the carrier plate and the CAM slide.

In another feature of the present invention, the slot includes a second horizontal section contiguous with the opening and the angled section. The length of the second horizontal section is such that the handle of the actuator bar is pulled into the cabinet until the end sits flush with the front opening of the cabinet.

In another feature, a second pin is fabricated in the actuator bar and rides in a second slot fabricated in the locking CAM slide.

The foregoing features and advantages of the invention will be more fully described in the accompanying drawings.

DETAILED DESCRIPTION OF THE PREFERRED EMBODIMENT

Figure 1:
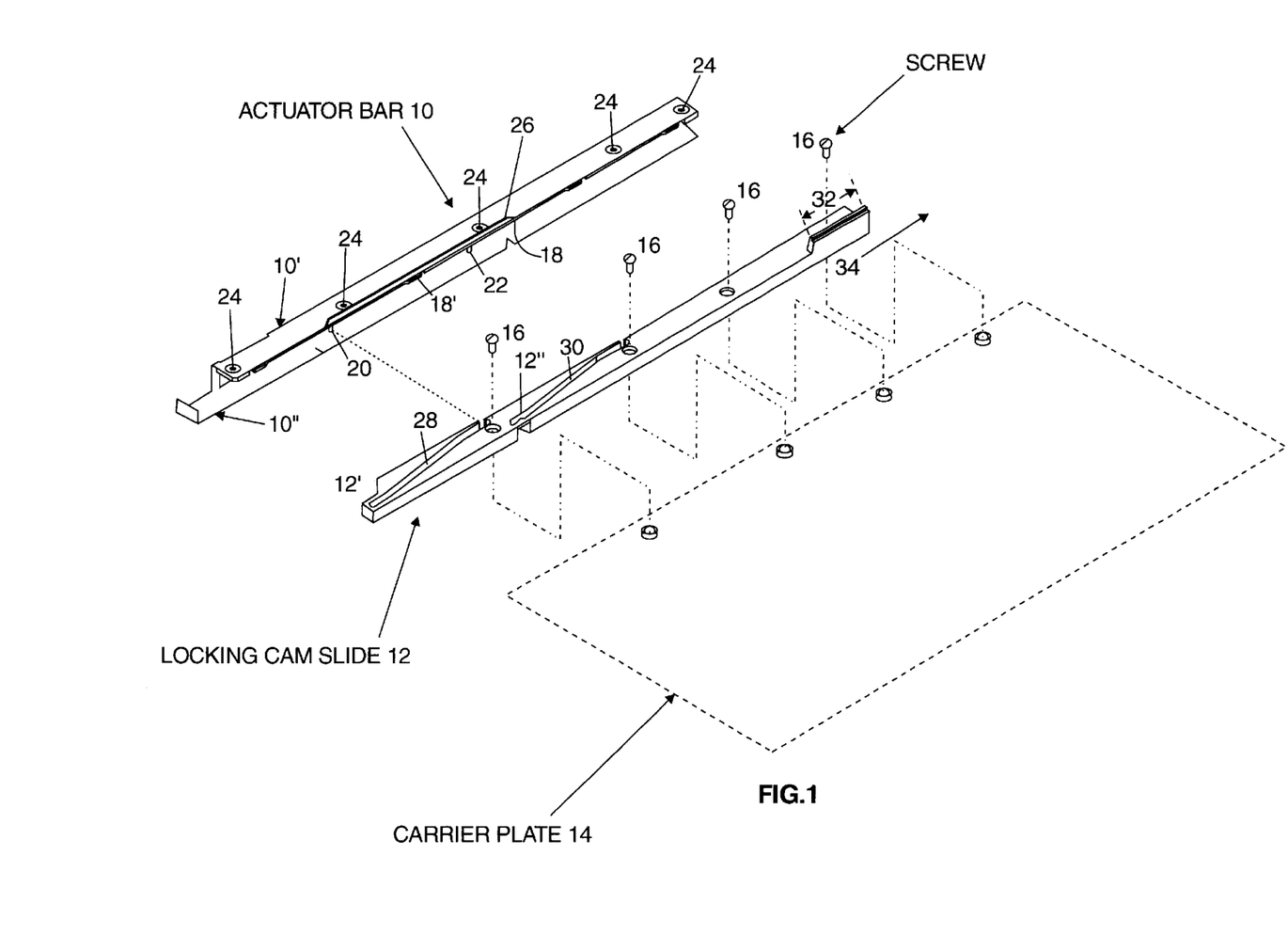
FIG. 1 shows an exploded view of the circuit card insertion assembly according to the teachings of the present invention.

FIG. 1 shows an exploded view of the circuit card assembly according to the teachings of the present invention. The circuit card assembly includes actuator bar 10, locking CAM slide 12, and carrier plate 14. The carrier plate 14 is connected to the locking CAM slide 12 by fastening means, including screws 16 inserted in openings fabricated in the locking CAM slide and the carrier plate. A circuit card (not shown) is fastened to the carrier plate 14. The actuator bar 10 is used to position the locking CAM slide 12 and the connected carrier plate 14 within a machine housing (not shown). The actuator bar 10 includes a substantial U-shaped member 10' with a handle 10". A metal insert 18 with protruding pins 20 and 22 are mounted by fasteners 24 to the inside of the U-shaped member 10'. The U-shaped member 10' has an upstanding edge 26 which rides within the guide (to be discussed hereinafter) mounted inside the machine housing. The insert is fitted into the U-shaped opening so that a Surface 18' extends outwardly away from upstanding edge 26. The surface 18' limits the extent to which the edge 26 protrudes into the guide slot (to be discussed later) of the guide member.

Still referring to FIG. 1, the locking CAM slide 12 includes slots 28 and 30. Each of the slots has openings as shown for accepting pins 20 and 22 when the locking CAM slide 12 is fitted within U-shaped member 10'. The locking CAM slide 12 includes notch 12' which allows easy access to handle 10" when the assembly is fitted within the housing of a machine. A guide member 32 is fabricated on the leading edge of the locking CAM slide 12. As will be discussed hereinafter, the function of the guide member 32 is to enable the insertion assembly to be easily inserted in the card carrier guide (discussed below). As is obvious, when components in the exploded view are assembled, the locking CAM slide 12 fits within the U-shaped housing 10' and the pins 20 and 22 ride in CAMs 28 and 30, respectively. The direction of insertion into a box or machine housing is shown by arrow 34. It should also be noted that the carrier plate 14 can take a plurality of different forms and the showing in FIG. 1 is not intended to limit the carrier guide to a specific type. The screws 16 coact with holes in the locking CAM slide 12 and the carrier plate to fasten them together. Other types of fastening mechanisms may be used without deviating from the scope or spirit of the present invention.

One of the features of the present invention is that the actuator bar 10 can be locked within the locking CAM slide 12 and does not move relative to the locking CAM slide 12. As will be discussed hereinafter, this locking feature allows the actuator bar and inserted locking CAM slide 12 to be moved as a single member while the assembly is inserted to a desired position within the housing. Thereafter, the lock is broken and the actuator bar is moved to its final position within the housing. The locking feature of the present invention can be provided in either of the slots 28 and 30. In the preferred embodiment of this invention, the locking feature 12" is provided in slot 30.

Figure 2A:
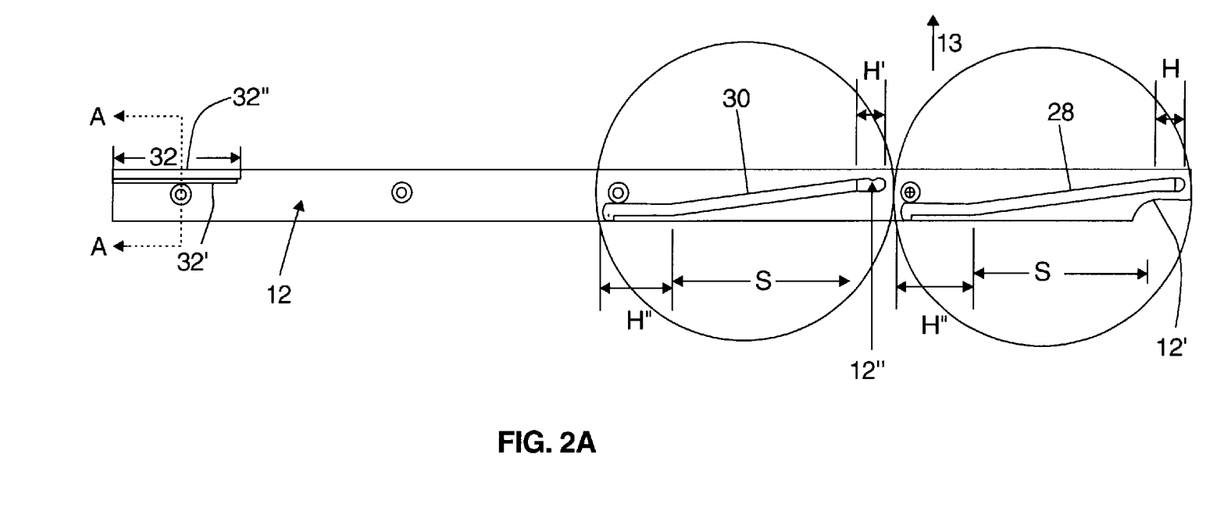
FIGS. 2A through 2E show details of the locking CAM slide according to the teaching of present invention.

Referring now to FIG. 2A, a top view of locking CAM slide 12 is shown. The top view includes guide member 32 and slots 28 and 30. Each of the slots has two substantially horizontal sections labelled H and H' and a sloping section labelled S. As will be described hereinafter, when the card is fully inserted in the box, the force on the handle 10" (FIG. 1) of the actuator bar causes the pin in the horizontal section H' of slot 30 to be dislodged from the lock 12" and, as both pins travel along their respective sloping surfaces, the card is forced into a perpendicular direction shown by arrow 13 and continues to move until it is fully inserted in the connector (not shown). The connector would be orientated at right angles to arrow 13. At that point, the pin then traverses the horizontal section H" on each of the slots. This portion H" of the slot is of sufficient length so that the handle 10" (FIG. 1) can be fully inserted into the housing of the machine. Because the handle of the mechanism is fully inserted in the housing, the faceplate that closes the opening through which the assembly was inserted sits flush against the housing and, as such, is better able to contain the EMC radiating from or into the machine.

Figure 2B:
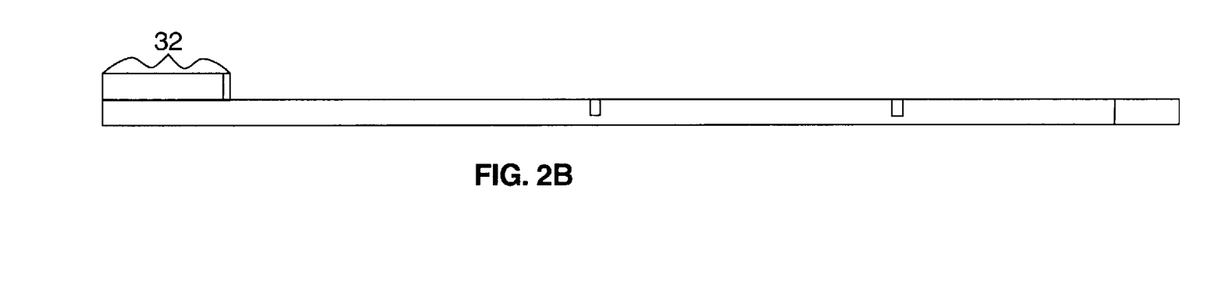

Turning to FIG. 2B, for the moment, the cross-section A—A through guide section 32 is shown. The guide section has a step upper surface. The portion labelled 32' is inserted into the guide slot in the housing, and the surface labelled 32" limits the extent to which surface 32 protrudes into the guide slot.

Figure 2C:
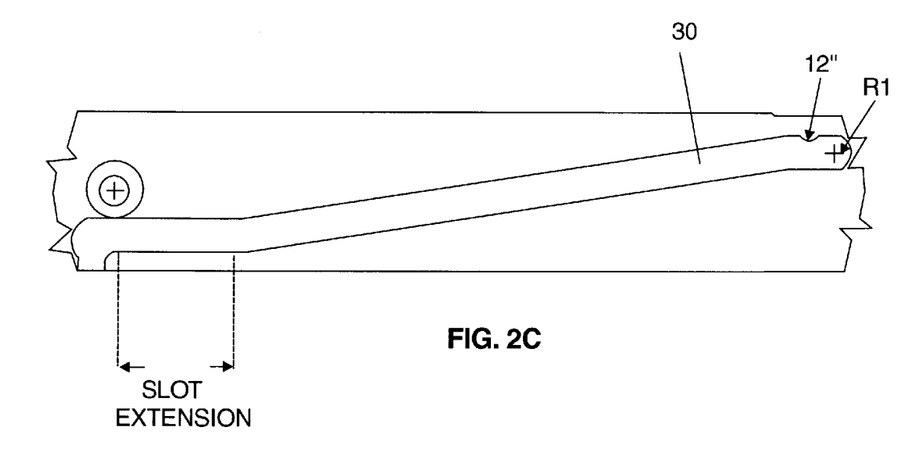
Figure 2D:
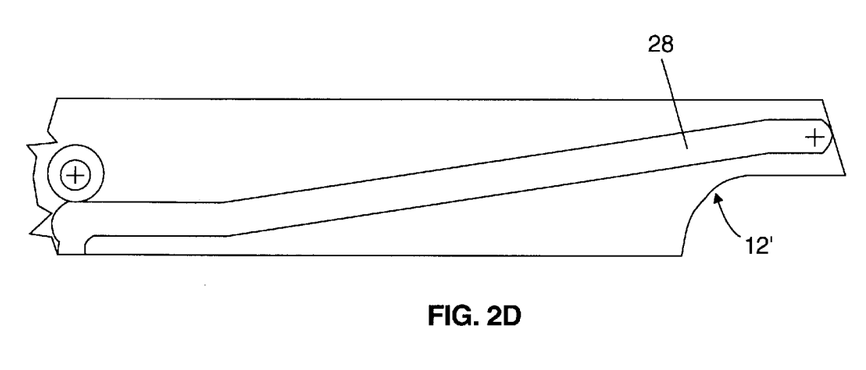
Figure 2E:
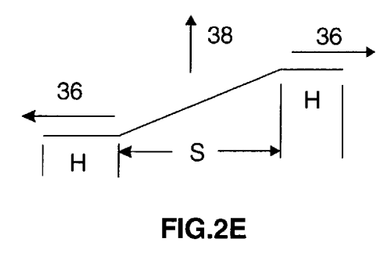

Turning now to FIGS. 2C, 2E and 2D, details of the slots are shown. Slot 30 includes a Rib or projection 12" and a closed circular portion of radius R1. The Rib protrudes into the slot to provide the locking feature when the pin (not shown) is positioned within the circular portion. The portion of the slot labelled slot extension is of such length that the handle on the actuator bar 10 can be fully inserted in the housing. In other words, by making the length of the slot extension section substantially equal to the handle 10" of the actuator bar 10 (FIG. 1), the handle is retracted and sits flush with the housing at the front surface of the machine.

In FIG. 2D, the notch 12', which allows a finger access to the handle 10" when the assembly is fulling inserted in the housing of a machine, is also shown. The notch is positioned relative to slot 28. With reference to FIG. 2E, a profile for each of the slots 28 and 30 is shown. The profile includes two horizontal sections labelled H and a sloping or inclined section labelled S. The horizontal sections provide motion in the direction shown by arrow 36 while the sloping section provides a vertical motion shown by arrow 38. It should also be noted that the arrow 36 is showing the insertion direction of the card assembly while the arrow 38, which is perpendicular to arrow 36, shows the direction in which the edge connector on the card (not shown) is inserted into a connector mounted in the box in which the card is inserted.

Figure 3A:
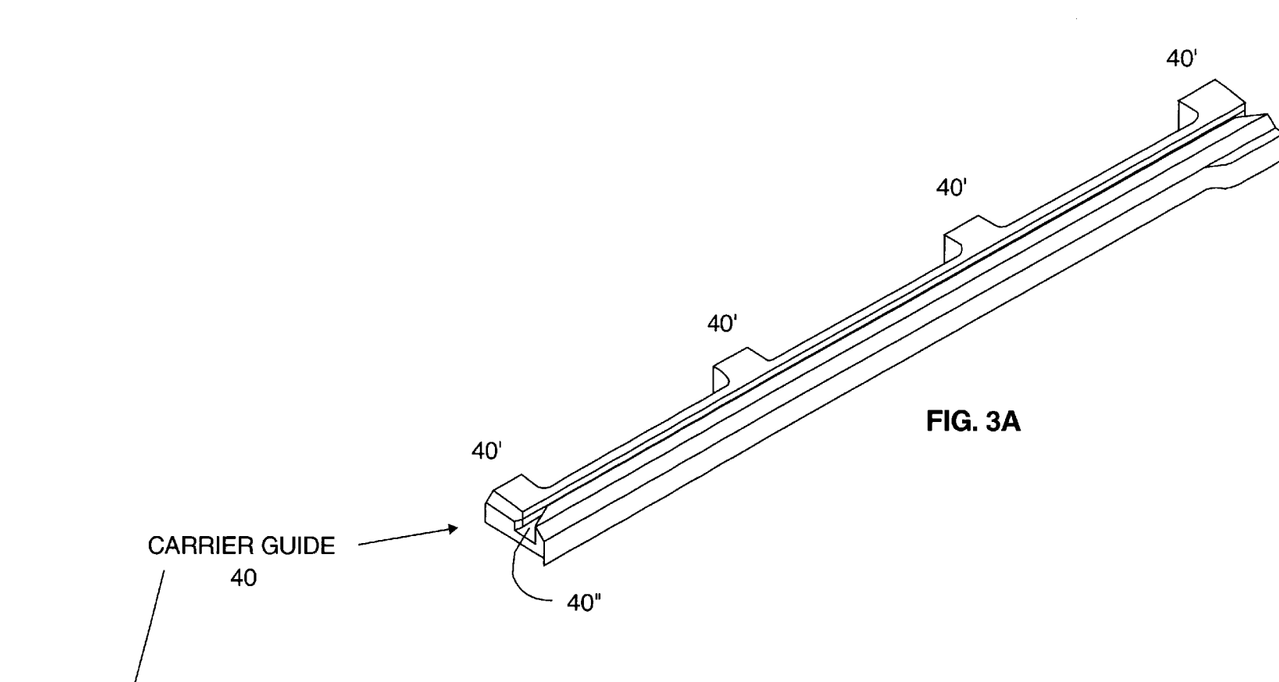
FIGS. 3A and 3B show the carrier guide that is mounted to the inside wall of a machine housing and guides the assembly of FIG. 1 as it is inserted into the machine.
Figure 3B:
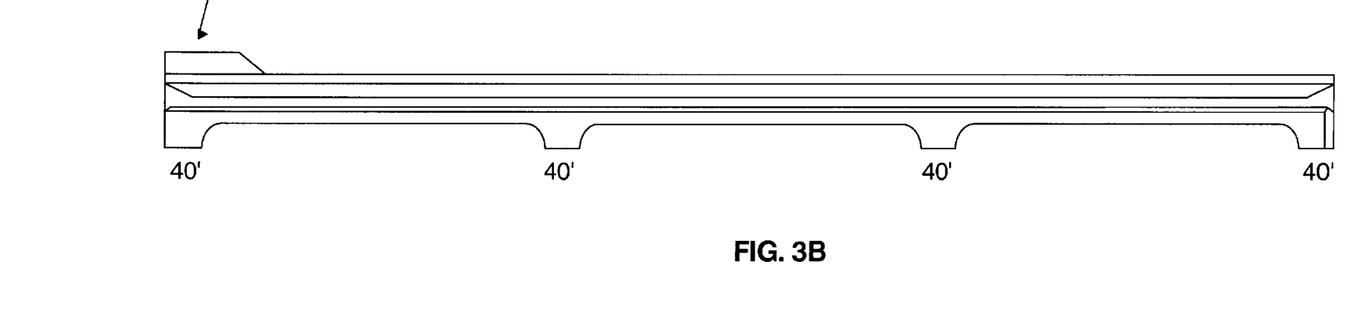

FIGS. 3A and 3B show the carrier guide member 40 which is inserted into the housing. The carrier guide member 40 is mounted to the side of the housing so that standoffs 40' are in contact with the housing. The guide slot 40" extends into the box laterally from the standoff members and longitudinally along the side of the box. The slot 40" provides the rails along which the actuator bar 10 (FIG. 1) is transported to insert or remove a circuit board. The sloping edges at the entrance of slot 40" makes it easier for the actuator bar and locking CAM slide (FIG. 1) to be inserted in the slot 40".

Figure 4:
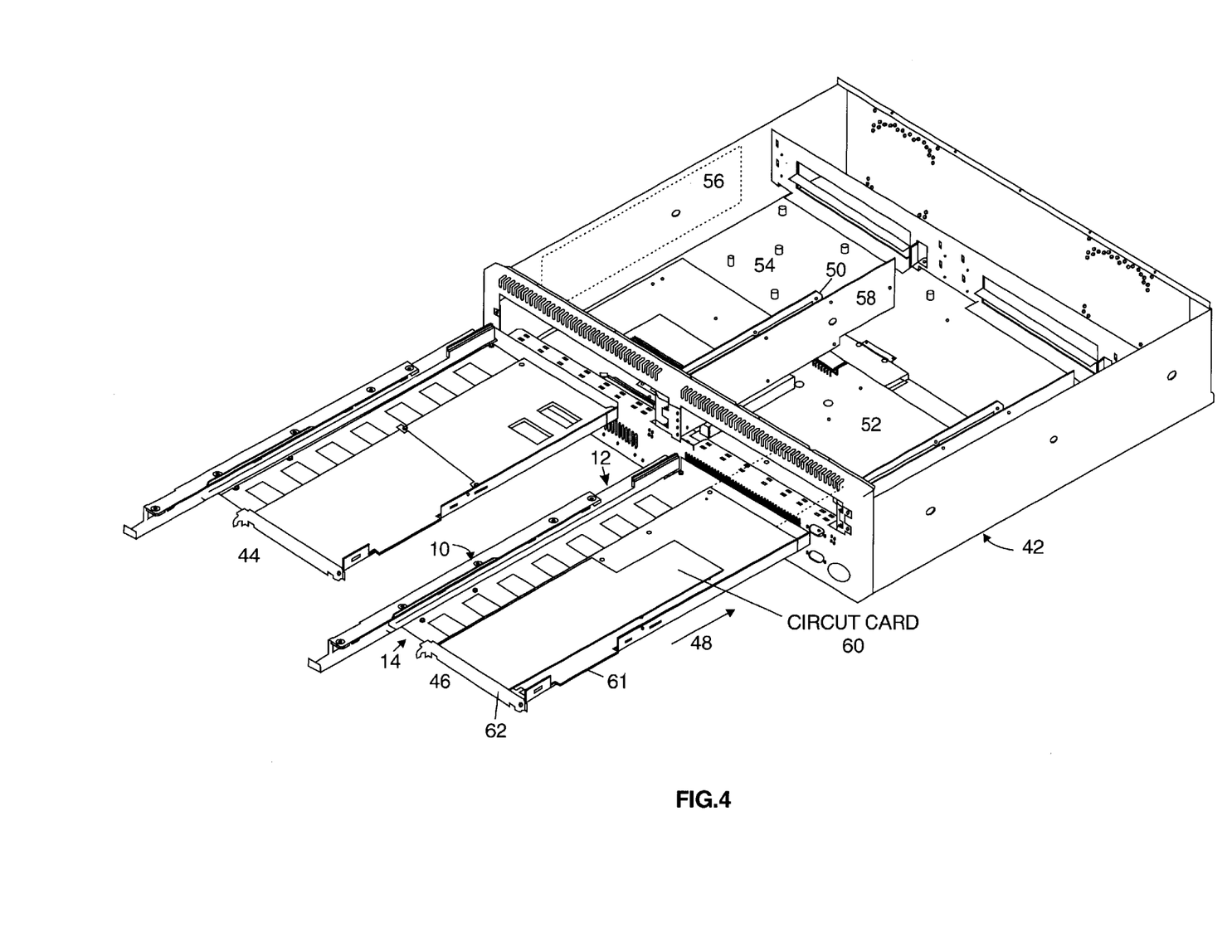
FIG. 4 shows an exploded view of a machine with the assembly of FIG. 1 poised to be inserted in the housing.

FIG. 4 shows an electrical machine having a housing 42 and two insertion assemblies 44 and 46 poised to be inserted through the front of the machine. For demonstration purposes, the top section and front of the housing is removed. The assembly is inserted in the direction shown by arrow 48. The housing 42 is divided by a separator 50 into card cages 52 and 54 in which two insertion assemblies can be mounted in stack relationship. The other components (such as power supply, fans, etc.) in the housing are not germane to the present invention and will not be described further. The carrier guide 40 discussed above is mounted on side members 56 and 58, respectively. Appropriate guide members are mounted on separator 50 to support the card as it travels along the guide members mounted on side 56. Similarly, appropriate guide members are mounted on the side of the box opposite to wall 58 for supporting the opposite side of the card. It should be noted that assemblies 44 and 46 are identical, therefore, only one of them will be discussed. It should be understood that the discussion of one of the assemblies such as 46 is intended to cover the other assembly. As discussed above, the insertion assembly includes the actuator bar 10 in which the locking CAM slide 12 is inserted. The actuator bar 10 is shown in its locked position wherein there is no motion relative to the locking CAM slide 12. Stated another way, the locking CAM slide 12 and the actuator bar 10 are moved as a single unit. The carrier plate 14 is attached to the locking CAM slide 12 and a circuit card 60 is attached to the carrier plate 14. The circuit card 60 has edge connector 61 which is fabricated in the card and is to be inserted in the connector not shown mounted in the housing. In this showing, a bracket 62 is shown attached to the carrier plate 14.

Figure 5A:
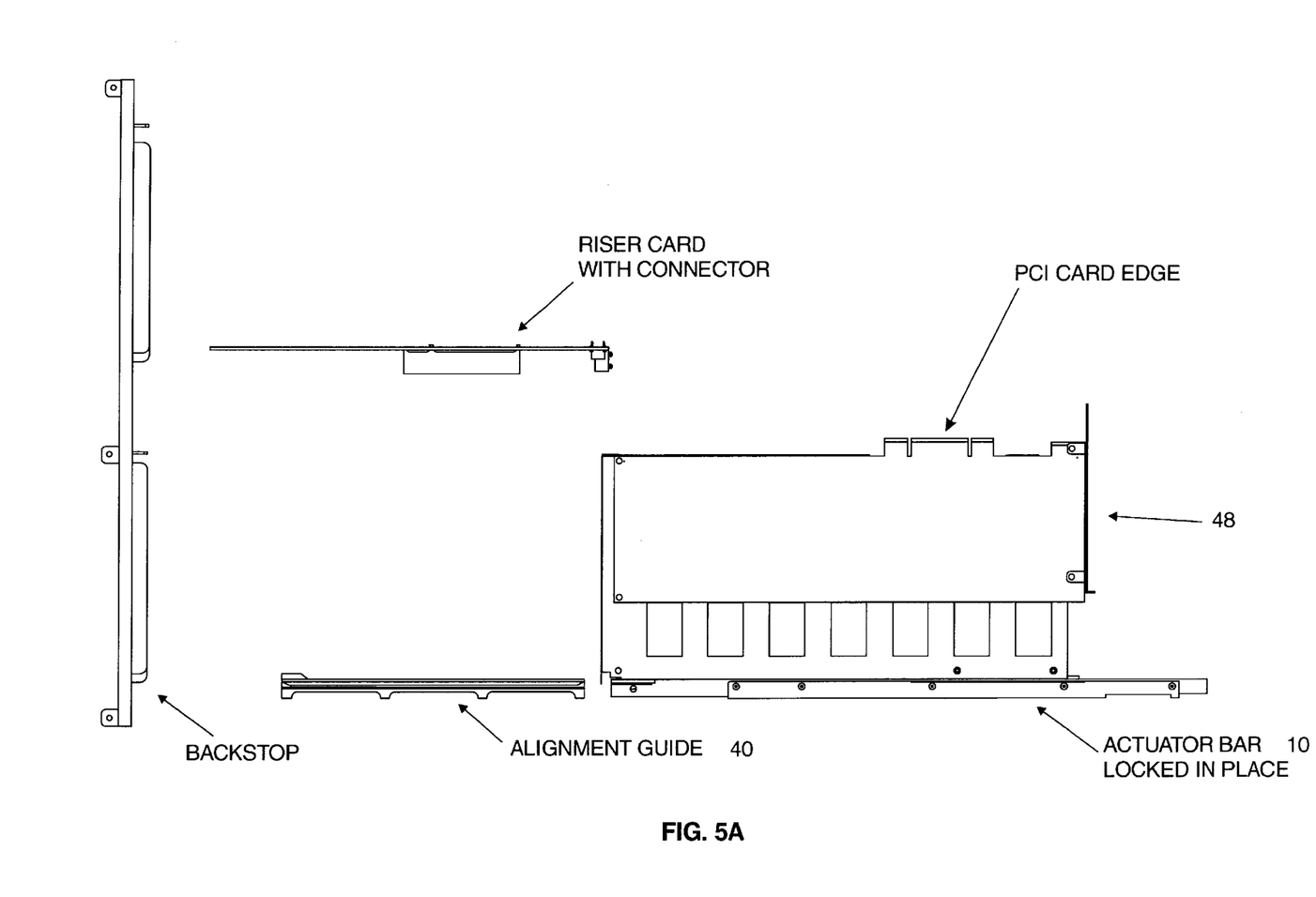
FIGS. 5A through 5E show different stages of the assembly being inserted into the housing.

FIGS. 5A through 5E show sketches illustrating the various stages of inserting the card assembly into the housing of the machine. In each view, only relevant portions of the machine housing is shown. In FIG. 5A, the illustration shows the backstop of the machine, the connector, the alignment guide and the insertion assembly with card disposed at the front of the machine. The direction of insertion in this view is shown by Arrow 48. In this view, the actuator bar 10 is shown in the locked position. As stated before, when the actuator bar is in the locked position, there is no movement between the bar and the locking CAM slide. As discussed above, the locking is provided by the rib extending upwardly from the surface of the slot. It should also be noted, in FIG. 5A, the PCI card edge with the edge connector is disposed to be inserted in the connector which is positioned on the riser card inside the box. In FIG. 5A, the showing is relative to a single card in the box. It should be noted that the same relationship exists between the other cards shown in FIG. 4.

Figure 5B:
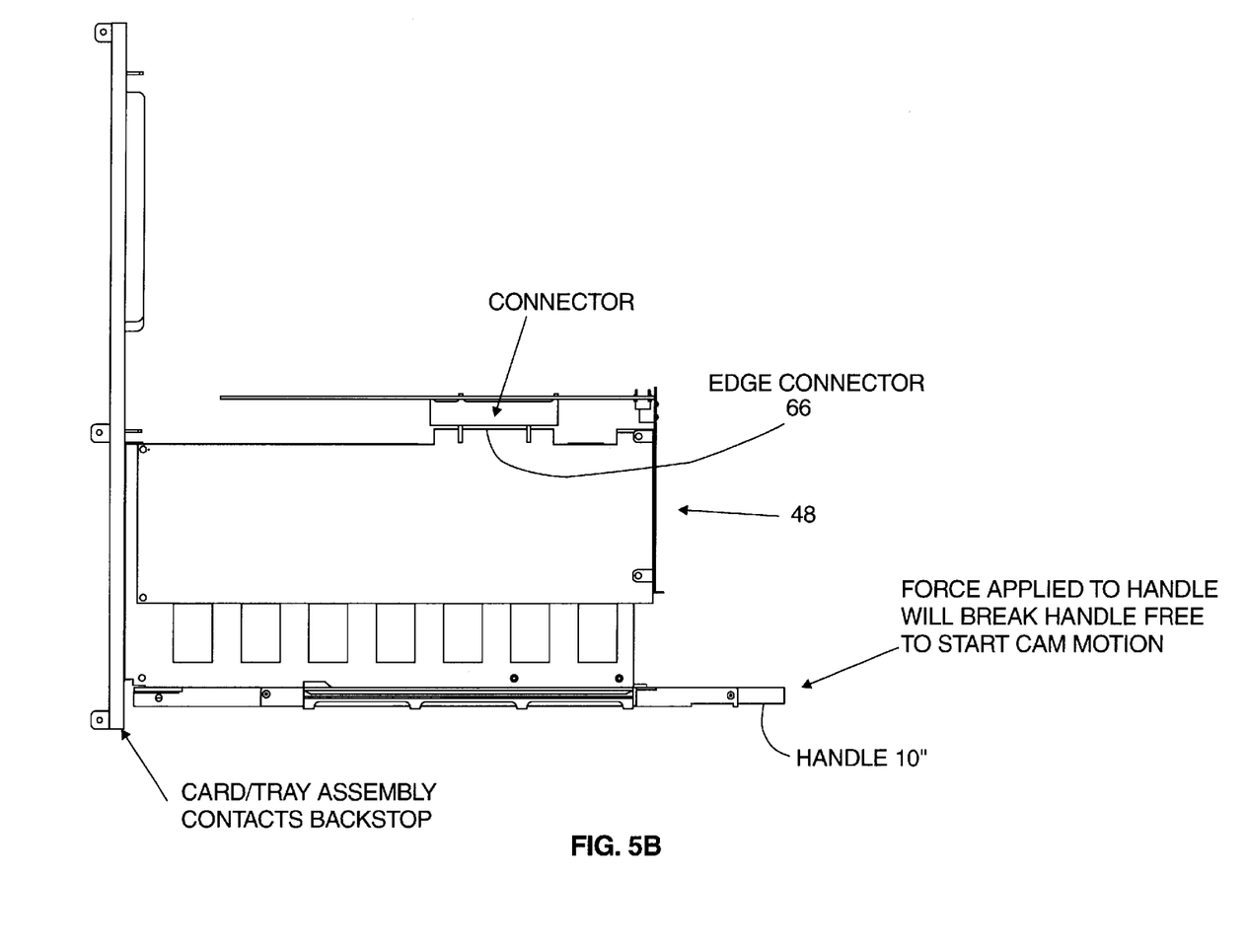

In FIG. 5B, the card tray is fully inserted in the box and the leading edge of the card carrier plate 14 sits flush against the backstop of the housing. In this position, the edge connector 66 on the card sits in alignment and over the card connector in the box. It should be noted that the direction of card insertion is parallel to the arrow 48 and is from the front of the box.

Figure 5C:
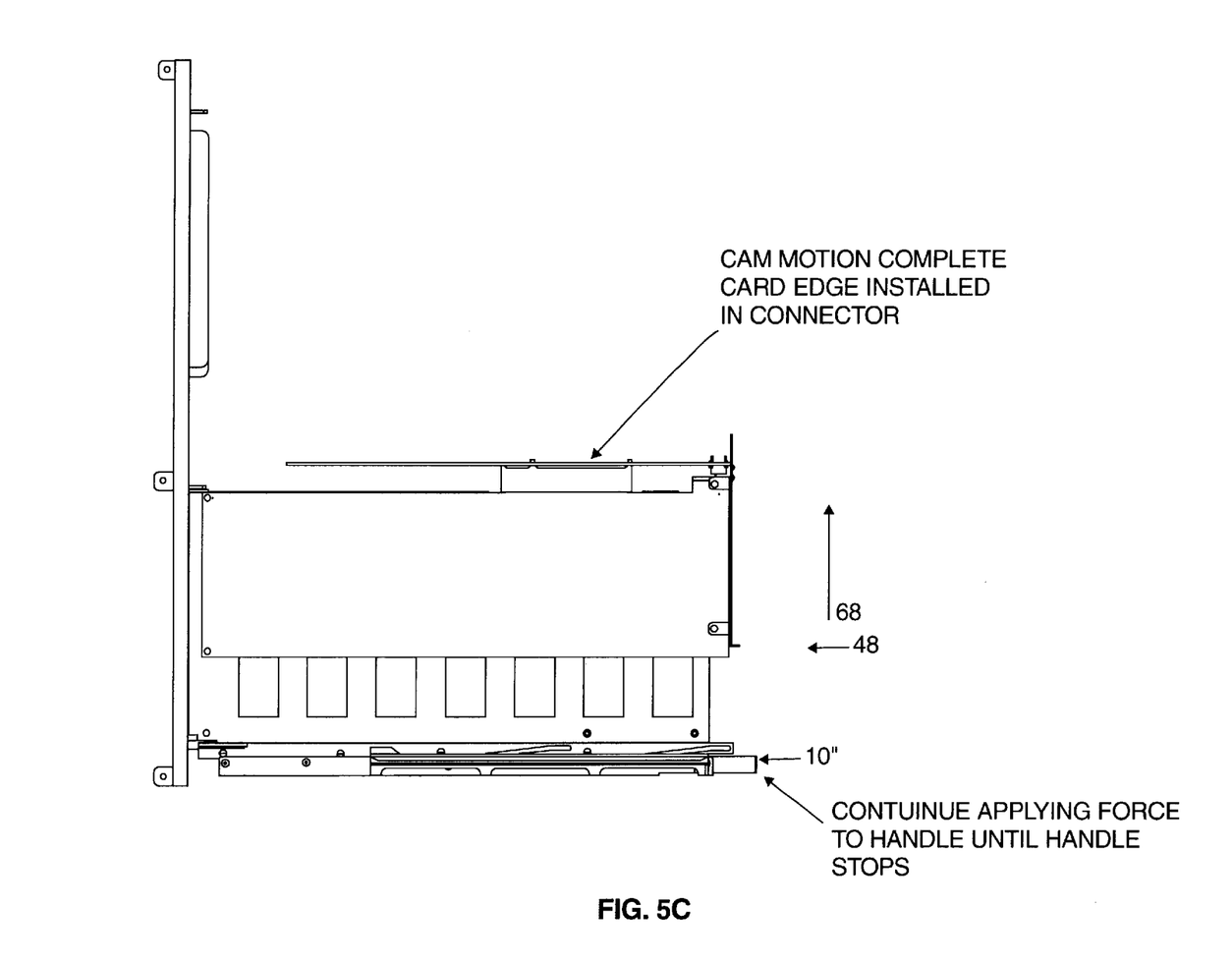

Still referring to FIG. 5B, it should be noted that when the leading edge of the card carrier plate 14 sits against the backstop, the actuator assembly is in locking relationship with the locking CAM slide 12 and a portion of it extends outwardly from the front as is shown in the figure. By applying force to Handle 10", the latch is broken by forcing the pin over the obstruction in its path. The pins move along the CAM slots 30 and 28 (FIGS. 1, 2C and 2D) and the card is now inserted in the connector as is shown in FIG. 5C. In order to insert the card edge connector in the connector mounted in the housing, the inclined portion in the respective slots forces the card to move in a perpendicular direction shown by arrow 68. It can be seen that the insertion direction is horizontal as shown by arrow 48 and the insertion direction into the connector is perpendicular (shown by arrow 68) which is also perpendicular to the insertion direction.

Figure 5D:
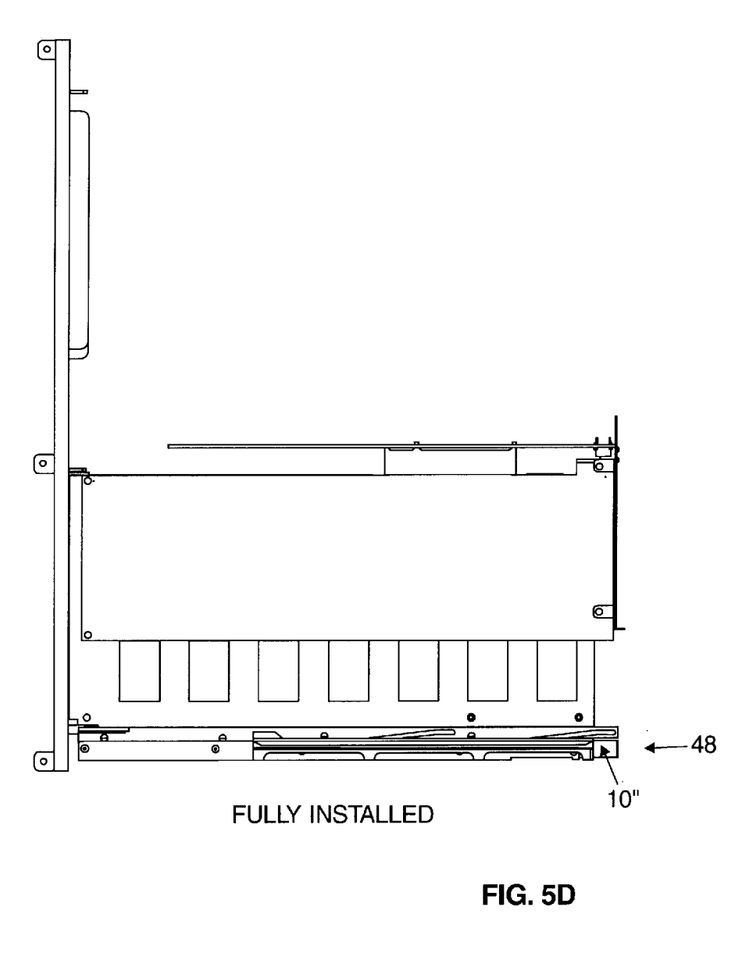
Figure 5E:
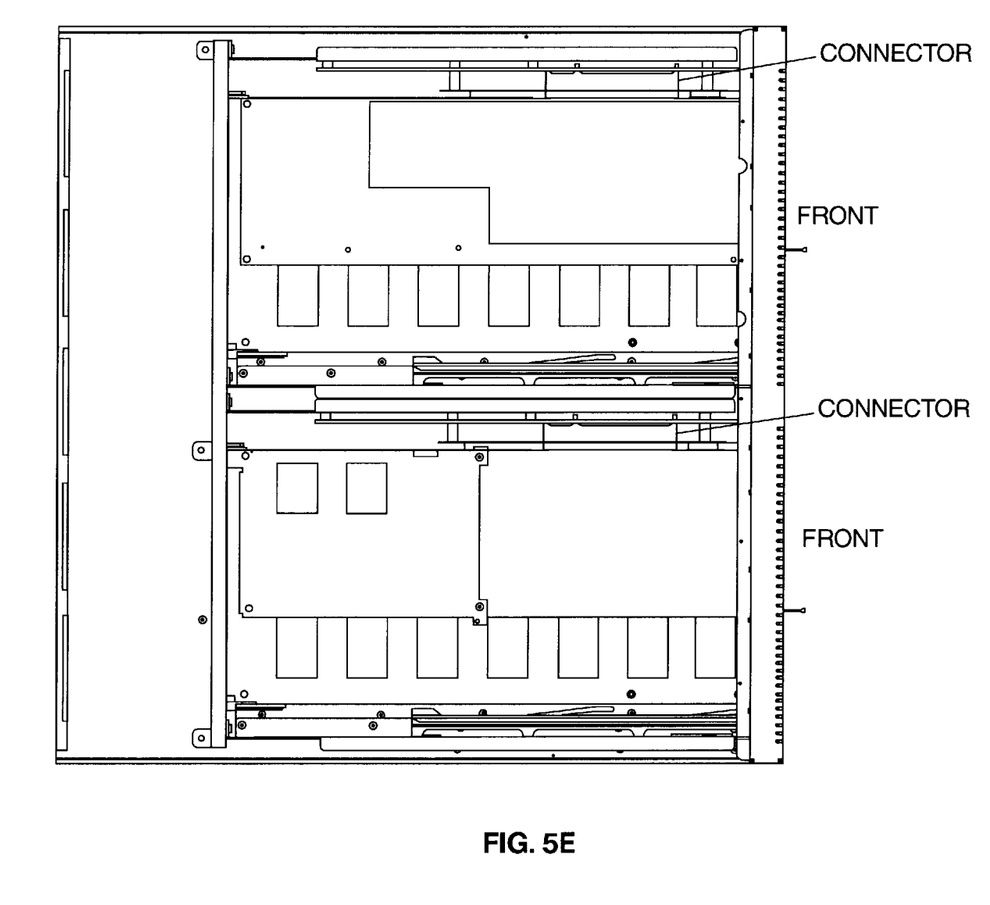

Still referring to FIG. 5C, in this orientation, even though the edge connector on the card is fully inserted into the connector in the housing, the handle 10" on the actuator bar still extends outside of the housing of the machine. To position the handle within the housing, force is continued to be applied against the handle and the pins move along their respective slots until the handle 10" sits flush with the front surface of the box shown in FIG. 5D. In FIG. 5D, the insertion assembly is fully installed in the housing. The direction of motion is still shown by arrow 48. Finally, in FIG. 5E, a top view of the housing with multiple card cages and card insertion assemblies fully inserted is shown.

As is evident from the above description, applicants' design provides several features which enhance the desirability of the machine. The feature includes the locking of the pins so that the actuator bar does not move relative to the locking CAM slide until the card cage is fully inserted in the box. Without this feature, binding of the mechanism could occur if during the installation, there is a small amount of force applied to the arm of the actuator bar before the assembly reaches its proper destination and encounters the stop. With the locking feature, the probability of binding is eliminated.

By extending the slot to provide additional movement of the pins after the edge connector is inserted in the connector, the arm on the actuator bar is positioned to sit flush with the front end inside the box. This greatly enhances the appearance of the box, eliminates opening of the front covers which would be required for clearance of the arm if it were outside of the housing. By providing a flush fit of the arm with the housing, the front cover can fit more closely to the housing and contain EMC more efficiently than if the handle were extended outside of the box.

The foregoing description of a preferred embodiment of the invention has been presented for the purposes of illustration and description. It is not intended to be exhaustive or to limit the invention to the precise form disclosed. Obvious modification or variations are possible in light of the above teachings. The embodiment was chosen and described to provide the best illustration of the principles of the invention and it is practical application, and to enable one of ordinary skill in the art to utilize the invention in various embodiment and with various modifications as are suited to particular use contemplated. Or such modifications and variations are within the scope of the invention as determined by the appended claims when interpreted in accordance with the breadth to which they are fairly, legally and equitably entitled.

We claim:

1. A machine sub-assembly including:
   an actuator bar having members defining a substantially U-shaped channel with at least one protrusion extending from one of the members into the channel;
   a cam slide with a side portion on which a slot having an angled portion and at least a horizontal portion is fabricated;
   a locking structure positioned within the slot;
   wherein said side portion of the cam slide is constrained to ride in the substantially U-shaped channel with the protrusion extending into the slot and being disposed to be placed in a first position to coact with the locking structure to prevent relative motion between the actuator bar and said cam slide or to be placed in an unlock position in which the actuator bar is free to move relative to the cam slide.

2. The machine sub-assembly of claim 1 further including a circuit board mounted on the cam slide.

3. The machine sub-assembly of claims 1 or 2 wherein the slot includes another horizontal section concatenated to the angled portion.

4. The machine sub-assembly of claim 3 wherein the actuator bar further includes a handle section.

5. The machine sub-assembly of claim 4 wherein the length of a portion of the slot is substantially equivalent to a length of the handle section.

6. The machine sub-assembly of claim 1 wherein the cam slide further includes a guide member, to guide the sub-assembly into a housing, fabricated relative to a first end of said cam slide.

7. The machine sub-assembly of claim 6 wherein the cam slide further includes a notch fabricated relative to another end of the cam slide.

8. The sub-assembly of claim 3 wherein the cam slide further includes a second slot fabricated in spaced relation to the first slot wherein said second slot includes an angled section and a pair of horizontal sections, with each one of the pair of horizontal sections connected to opposite ends of said angled section.

9. The sub-assembly of claim 1 wherein the locking structure includes a protrusion extending from a sidewall of said slot.

10. The machine sub-assembly of claim 1 further including a housing with an opening for inserting or removing the sub-assembly; and guide members mounted to inside walls of said housing.

11. A machine subassembly including:

a CAM slide with at least one slot fabricated therein;

a locking mechanism fabricated in the slot;

a card carrier operatively connected to the slide; and an actuator bar including members configured into a substantially U-shaped channel and at least one pin extending from a member into the U-shaped channel wherein the CAM slide is placed in the U-shaped channel with the at least one pin disposed in the at least one slot and coacting with the locking mechanism to restrain the actuator bar from motion relative to the CAM slide.

\* \* \* \* \*